(12) United States Patent
Lin

(10) Patent No.: US 8,477,489 B2
(45) Date of Patent: Jul. 2, 2013

(54) CONTAINER DATA CENTER SYSTEM

(75) Inventor: Tai-Wei Lin, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 288 days.

(21) Appl. No.: 13/071,492

(22) Filed: Mar. 24, 2011

(65) Prior Publication Data

US 2012/0152777 A1 Jun. 21, 2012

(30) Foreign Application Priority Data

Dec. 15, 2010 (TW) .................................. 099144016

(51) Int. Cl.
 *H05K 7/20* (2006.01)

(52) U.S. Cl.
 USPC ............ 361/679.46; 361/679.49; 361/679.53; 361/688; 361/689; 361/690; 361/701; 165/80.4; 165/80.5; 165/104.33; 165/185; 62/259.2

(58) Field of Classification Search
 USPC ....... 361/679.46–679.53, 688, 689, 690–727; 165/80.2, 80.3, 80.4, 80.5, 104.33, 185, 121–126; 62/259.2, 199; 454/118, 184; 29/890.03; 312/223.2, 223.3, 334.28, 334.24
 See application file for complete search history.

(56) References Cited

U.S. PATENT DOCUMENTS

| | | | | |
|---|---|---|---|---|
| 7,278,273 | B1 * | 10/2007 | Whitted et al. | 62/259.2 |
| 7,511,959 | B2 * | 3/2009 | Belady et al. | 361/701 |
| 7,738,251 | B2 * | 6/2010 | Clidaras et al. | 361/701 |
| 7,852,627 | B2 * | 12/2010 | Schmitt et al. | 361/695 |
| 8,077,457 | B2 * | 12/2011 | Gauthier et al. | 361/690 |
| 8,218,322 | B2 * | 7/2012 | Clidaras et al. | 361/701 |
| 8,251,785 | B2 * | 8/2012 | Schmitt et al. | 454/184 |
| 2008/0094797 | A1 * | 4/2008 | Coglitore et al. | 361/687 |
| 2009/0229194 | A1 * | 9/2009 | Armillas | 52/79.1 |
| 2011/0239679 | A1 * | 10/2011 | Dechene et al. | 62/259.2 |

\* cited by examiner

*Primary Examiner* — Michail V Datskovskiy
(74) *Attorney, Agent, or Firm* — Altis Law Group, Inc.

(57) ABSTRACT

A container data center system includes a plurality of container data centers and a dissipation system. Each container data center includes a container and a number of servers arranged in the container. The containers of the container data centers communicate with each other. The heat dissipation system includes a refrigerating device configured for generating cooling air to one of the containers.

8 Claims, 4 Drawing Sheets

CONTAINER DATA CENTER SYSTEM

BACKGROUND

1. Technical Field

The present disclosure relates to container data center systems and, particularly, to a container data center system with a heat dissipation system.

2. Description of Related Art

A number of container data centers are often stacked one by one for saving space. Each container data center usually includes a container, a plurality of servers, and a heat dissipation system. The servers and the heat dissipation system are arranged in the corresponding containers. The heat dissipation system arranged in each of the containers usually includes at least a refrigerating device such as an air conditioner. That is, each container requires at least one air conditioner, which increases the cost of the container data center system.

Therefore, it is desirable to provide a container data center system, which can overcome the limitations described.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

DETAILED DESCRIPTION

Embodiments of the present disclosure will now be described in detail with reference to the drawings.

Figure 1:
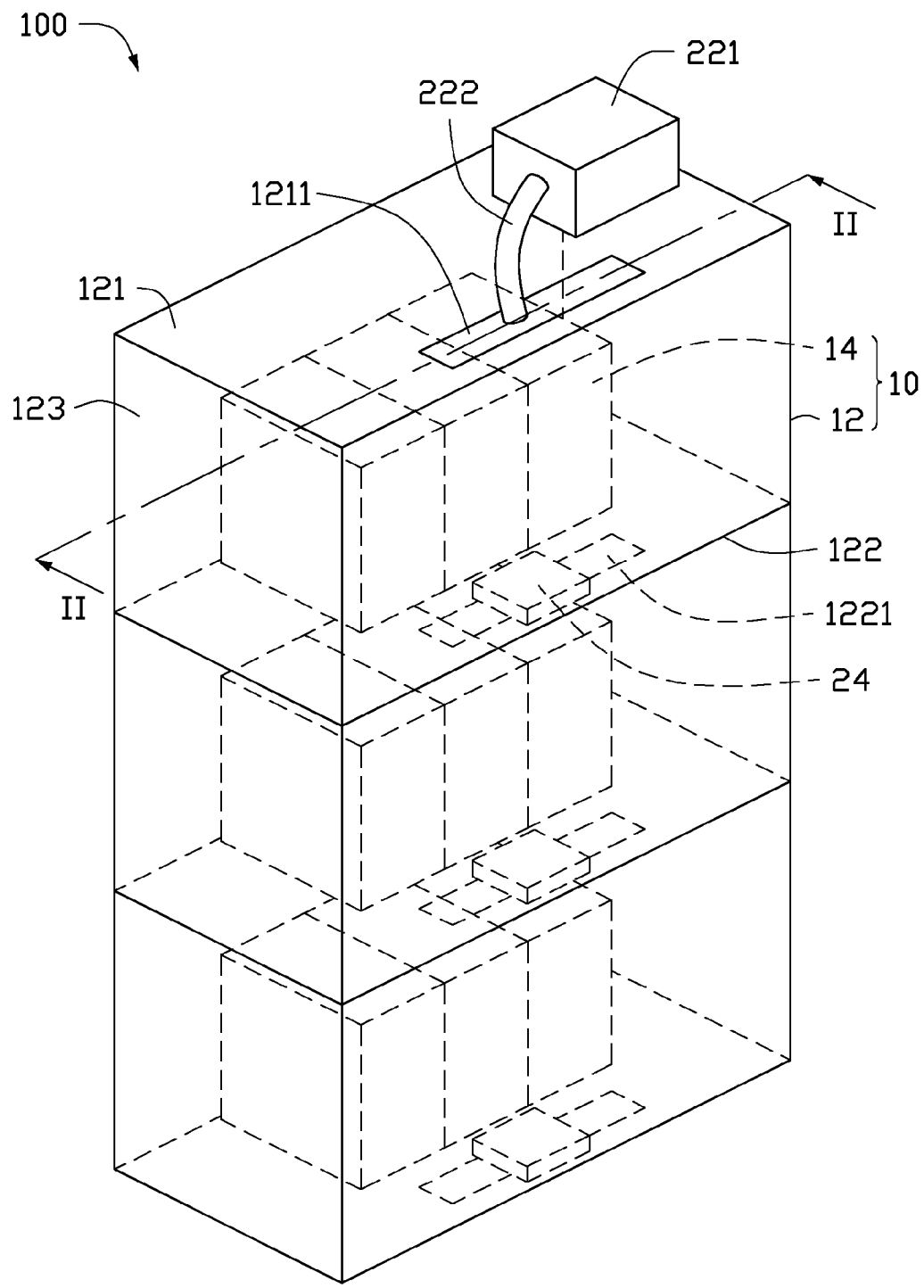
FIG. 1 is an isometric schematic view of a first embodiment of a container data center system.
Figure 2:
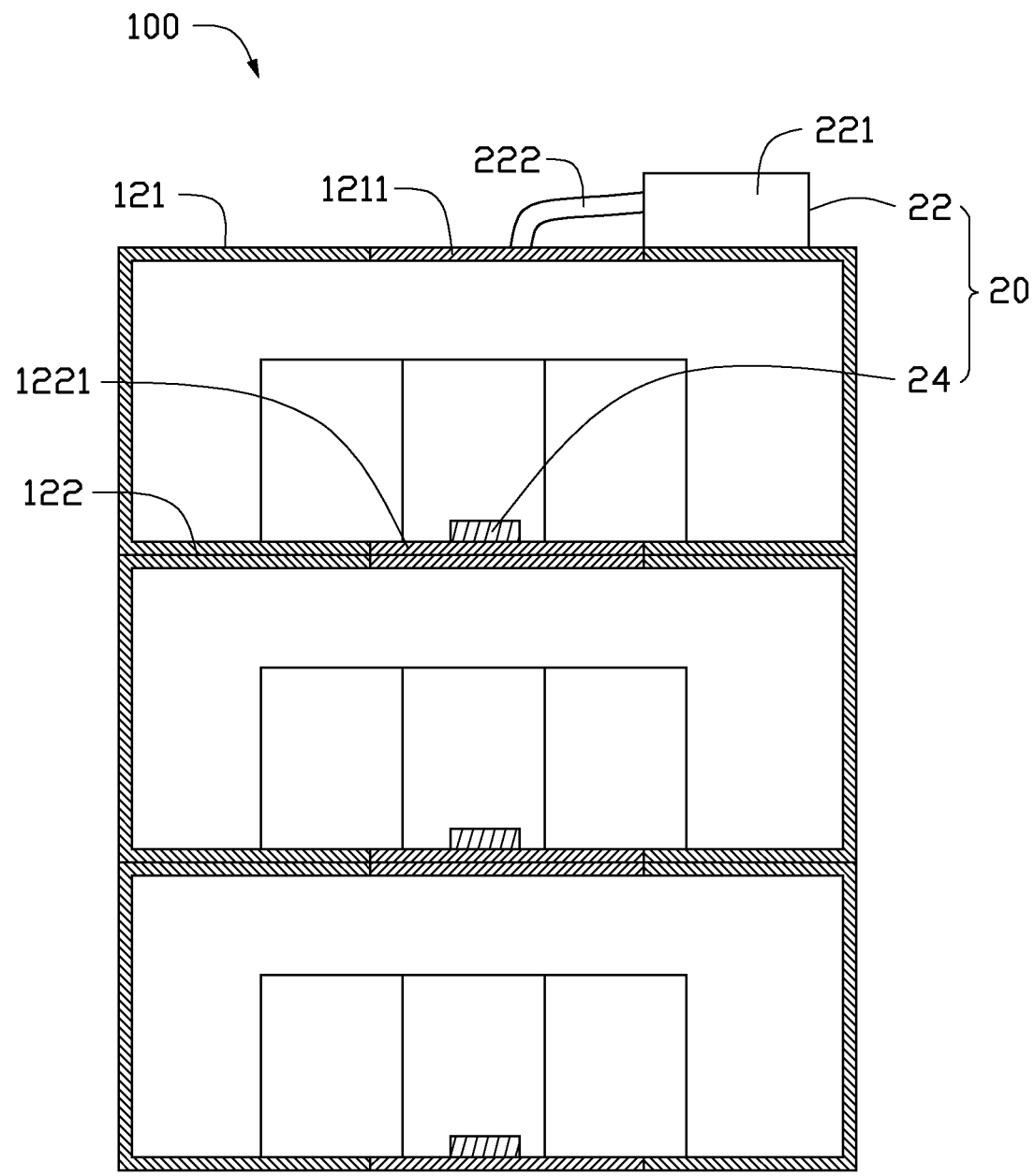
FIG. 2 is a cross-sectional view taken along a line II-II of FIG. 1.

Referring to FIG. 1 and FIG. 2, a container data center system 100, according to a first embodiment, includes a stack of three container data centers 10 and a heat dissipation system 20. Each container data center 10 includes a container 12 and a number of servers 14.

Each container 12 is substantially a hollow cuboid and includes a top plate 121, a bottom plate 122 opposite to the top plate 121 and four sidewalls 123 perpendicularly connected between the top plate 121 and the bottom plate 122. The top plate 121 is generally rectangular and includes a pair of first sides and a pair of second sides (not labeled). The first sides are each longer than that of each second side. The top plate 121 defines a rectangular first valve 1211. The first valve 1211 includes a pair of third sides and a pair of fourth sides (not labeled). The third sides are each longer than that of each fourth side. The third sides are parallel to the first sides. The first valve 1211 is substantially located at the center of the top plate 121 lengthwise (i.e., along the first side) and adjacent to one of the first sides. The servers 14 are arranged on the bottom plate 122 along a direction parallel to the first sides. The bottom plate 122 defines a second valve 1221 adjacent to the servers 14 corresponding to the first valve 1211 in size and position. The first valve 1211 and the second valve 1221 can be opened or closed by setting a gate or a door. The second valve 1221 of the top container 12 is aligned with the first valve 1211 of the middle container 12. The second valve 1221 of the middle container 12 is aligned with the first valve 1211 of the bottom container 12.

The dissipation system 20 includes a refrigerating device 22 and three blowing devices 24. In this embodiment, the refrigerating device 22 is an air conditioner, and the blowing devices 24 are axial fans. The refrigerating device 22 includes a main body 221 and a pipe 222. The main body 221 is configured for generating cooling air. The main body 221 is detachably mounted to the outer surface of the top plate 121 of the top container 12. The pipe 222 is configured for transmitting the cooling air. One end of the pipe 222 is connected to the main body 221. The other end of the pipe 222 is connected to the first valve 1211 of the top container 12. Each blowing device 24 is mounted to the inner surface of the bottom plate 122 of a corresponding container 12 and is adjacent to a corresponding second valve 1221.

The servers 14 arranged in the three respective containers 12 generate a great amount of heat when operated, in which case the first valves 1211 and the second valves 1221 of the three containers 12 are opened. Thus, the three containers 12 are physically communicate with each other for ventilation purposes. The main body 221 is powered on for generating cooling air. The cooling air is transmitted by the pipe 222 and flow through the first valve 1211 into the top container 12. The three blowing devices 24 are powered on and configured for blowing the cooling air away from the main body 221. Concretely, the three blowing devices 24 respectively blow the cooling air from the top container 12 to the middle container 12, and from the middle container 12 to the bottom container 12, and then from the bottom container 12 to outside, thus dissipating heat generated by the servers 14 arranged in the three containers 12. The first valves 1211 and the second valves 1221 of the three containers 12 cooperatively form a long and narrow air channel, and heat in the three containers 12 can be efficiently dissipated.

In this embodiment, the main body 221 is mounted to the outer surface of the top plate 121 of the top container 12 to reduce the length of the pipe 222. In alternative embodiments, the main body 221 can be mounted to the outer surface of the sidewalls 123 of the top container 12.

The heat dissipation system 20 can include only one refrigeration device 22, the cooling air generated by the refrigeration device 22 diffuses to the middle container 12 and the bottom container 12.

Figure 3:
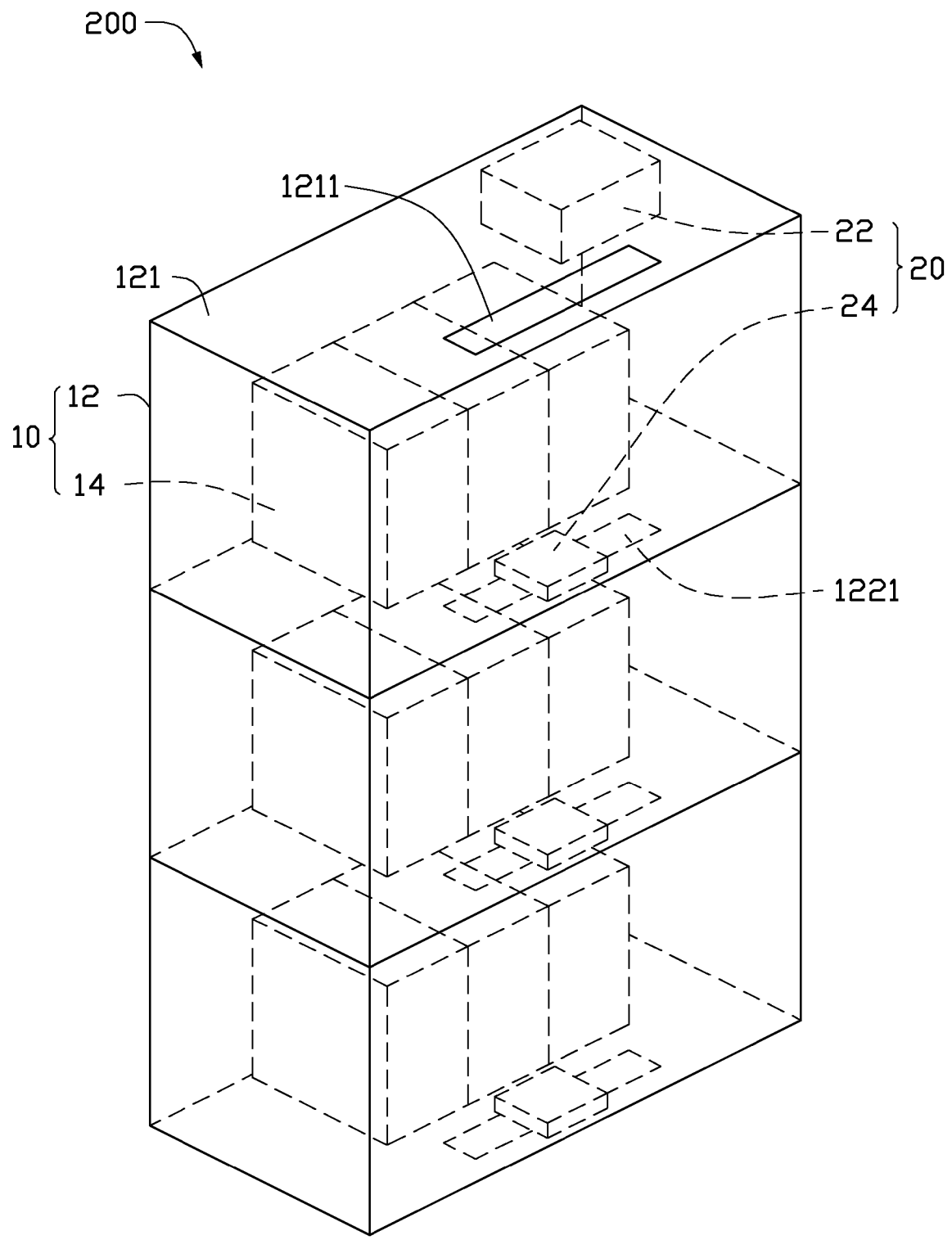
FIG. 3 is an isometric schematic view of a second embodiment of a container data center system.

Referring to FIG. 3, a second embodiment of a container data center system 200 is similar to the container data center system 100 of FIGS. 1 and 2, except that the refrigerating device 22 is detachably mounted to the inner surface of the top plate 121 of the top container 12. Each blowing device 24 is mounted to the inner surface of the bottom plate 122 of a corresponding container 12 and is adjacent to a corresponding second valve 1221.

Figure 4:
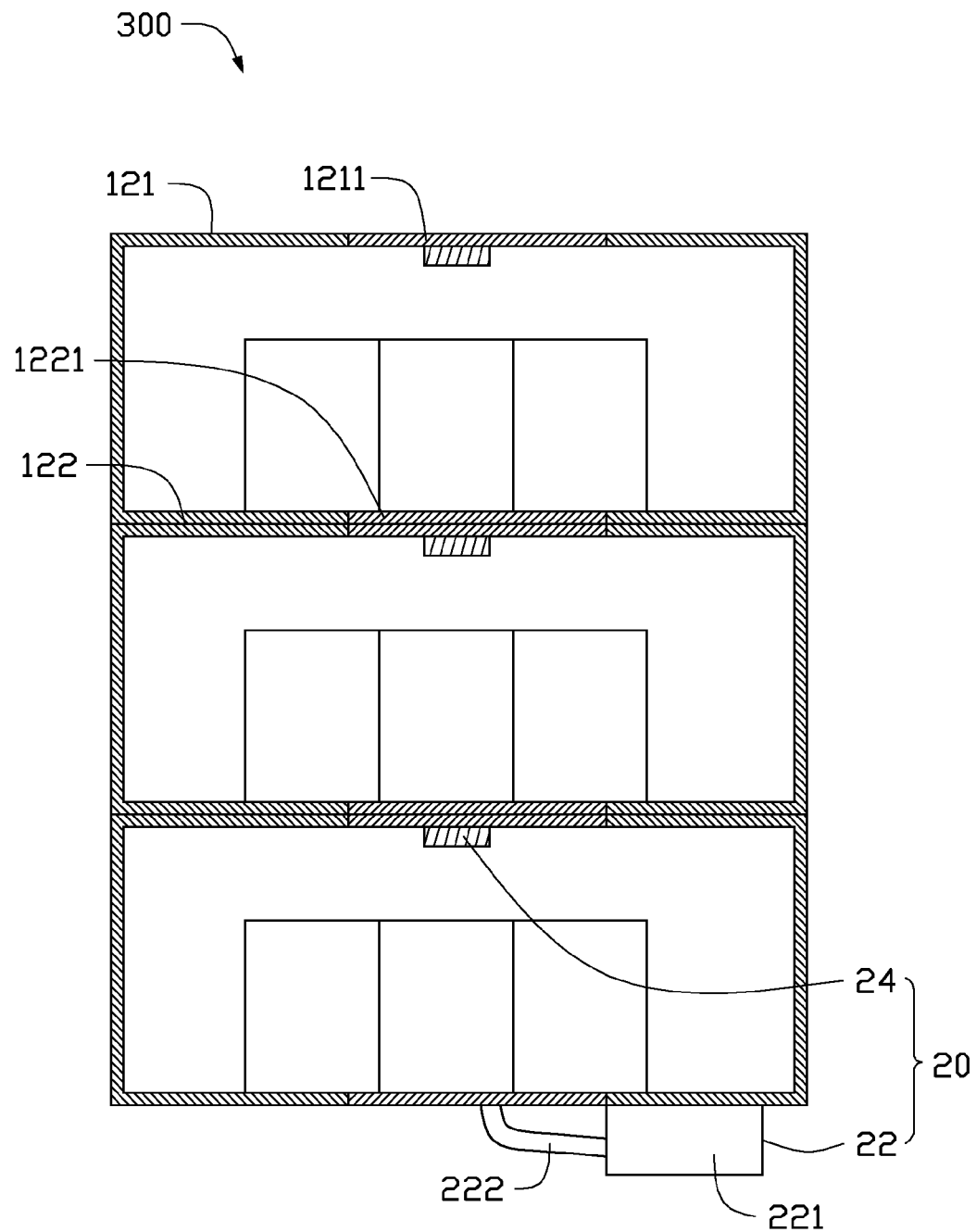
FIG. 4 is a cross-sectional view of a third embodiment of a container data center system.

Referring to FIG. 4, a third embodiment of a container data center system 300 of is similar to the container data center system 100 of FIGS. 1 and 2, except that the main body 221 is mounted to the outer surface of the bottom plate 122 of the bottom container 12, and each blowing device 24 is mounted to the inner surface of the top plate 121 of a corresponding container 12 and is adjacent to a corresponding first valve 1211. The three blowing devices 24 are respectively configured for blowing the cooling air from the bottom container 12 to the middle container 12, from the middle container 12 to the top container 12, and then from the bottom container 12 to outside, thus dissipating heat generated by the servers 14 arranged in the three containers 12. Understandably, the refrigerating device 22 can be mounted to the inner surface of the bottom plate 122 or on the outer surface of the sidewalls 123 of the bottom container 12.

It will be understood that the number of the container data centers 10 is not limited to three. The number of the container data centers 10 can be two or more than three.

It will be understood that the above particular embodiments are shown and described by way of illustration only. The principles and the features of the present disclosure may be employed in various and numerous embodiment thereof without departing from the scope of the disclosure as claimed. The above-described embodiments illustrate the scope of the disclosure but do not restrict the scope of the disclosure.

What is claimed is:

1. A container data center system, comprising:
a plurality of container data centers, each container data center comprising a container and a number of servers arranged in the container, the containers of the container data centers communicating with each other; and
a heat dissipation system comprising a refrigerating device,
wherein the refrigerating device is configured for generating cooling air to one of the containers; the containers are stacked one by one and comprises at least a top container and at least a bottom container, each container is substantially a hollow cube and comprises a top plate, a bottom plate opposite to the top plate, and four sidewalls perpendicularly connected between the top plate and the bottom plate, the top plate comprise a first valve, the bottom plate comprise a second valve corresponding to the first valve, the first valve and the second valve the corresponding container are capable of being opened such that the containers communicate with each other; and the refrigerating device comprises a main body and a pipe, the main body is detachably mounted to the outer surface of the top plate of the top container and configured for generating the cooling air, the pipe is configured for transmitting the cooling air from the main body to the top container, one end of the pipe is connected to the main body, the other end of the pipe is connect to the first valve of the top container.

2. The container data center system of claim 1, further comprising a plurality of blowing devices, each blowing device being mounted to the inner surface of the bottom plate of a corresponding container and being adjacent to the second valve of the corresponding container, the blowing device being configured for blowing the cooling air along a direction from the top container to the bottom container.

3. The container data center system of claim 2, wherein the blowing devices are axial fans.

4. A container data center system, comprising:
a plurality of container data centers, each container data center comprising a container and a number of servers arranged in the container, the containers of the container data centers communicating with each other; and
a heat dissipation system comprising a refrigerating device,
wherein the refrigerating device is configured for generating cooling air to one of the containers; the containers are stacked one by one and comprises at least a top container and at least a bottom container, each container is substantially a hollow cube and comprises a top plate, a bottom plate opposite to the top plate, and four sidewalls perpendicularly connected between the top plate, and the bottom plate, the top plate comprise a first valve, the bottom plate comprise a second valve corresponding to the first valve, the first valve and the second valve the corresponding container are capable of being opened such that the containers communicate with each other; and the refrigerating device is detachably mounted to the inner surface of the top plate of the top container.

5. A container data center system, comprising:
a plurality of container data centers, each container data center comprising a container and a number of servers arranged in the container, the containers of the container data centers communicating with each other; and
a heat dissipation system comprising a refrigerating device,
wherein the refrigerating device is configured for generating cooling air to one of the containers; the containers are stacked one by one and comprises at least a top container and at least a bottom container, each container is substantially a hollow cube and comprises a top plate, a bottom plate opposite to the top plate, and four sidewalls perpendicularly connected between the top plate and the bottom plate, the top plate comprise a first valve, the bottom plate comprise a second valve corresponding to the first valve, the first valve and the second valve the corresponding container are capable of being opened such that the containers communicate with each other; and the refrigerating device comprises a main body and a pipe, the main body is detachably mounted to the outer surface of the bottom plate of the bottom container and configured for generating the cooling air, the pipe is configured for transmitting the cooling air from the main body to the bottom container, one end of the pipe is connected to the main body, the other end of the pipe is connect to the second valve of the bottom container.

6. The container data center system of claim 5, comprising a plurality of blowing devices, each blowing device being mounted to the inner surface of the top plate of a corresponding container and being adjacent to the first valve of the corresponding container, the blowing device being configured for blowing the cooling air along a direction from the bottom container to the top container.

7. The container data center system of claim 1, wherein the servers of one container data center are positioned on the bottom plate of the container of the container data center and adjacent to the second valve of the container data center.

8. The container data center system of claim 1, wherein the refrigerating device is an air conditioner.

* * * * *